United States Patent
Kinney et al.

(10) Patent No.: US 6,965,137 B2
(45) Date of Patent: Nov. 15, 2005

(54) MULTI-LAYER CONDUCTIVE MEMORY DEVICE

(75) Inventors: Wayne Kinney, Emmett, ID (US); Steven W. Longcor, Mountain View, CA (US); Darrell Rinerson, Cupertino, CA (US); Steve Kuo-Ren Hsia, San Jose, CA (US)

(73) Assignee: Unity Semiconductor Corporation

( * ) Notice: Subject to any disclaimer, the term of this patent is extended or adjusted under 35 U.S.C. 154(b) by 0 days.

(21) Appl. No.: 10/605,757

(22) Filed: Oct. 23, 2003

(65) Prior Publication Data

US 2004/0159867 A1 Aug. 19, 2004

Related U.S. Application Data

(63) Continuation-in-part of application No. 10/330,512, filed on Dec. 26, 2002, now Pat. No. 6,753,561.
(60) Provisional application No. 60/400,849, filed on Aug. 2, 2002, provisional application No. 60/422,922, filed on Oct. 31, 2002, and provisional application No. 60/424,083, filed on Nov. 5, 2002.

(51) Int. Cl.[7] .............................................. H01L 31/062
(52) U.S. Cl. ................. 257/295; 257/421; 257/E27.006
(58) Field of Search ................................ 257/295, 421, 257/E27.006

(56) References Cited

U.S. PATENT DOCUMENTS

| | | | | |
|---|---|---|---|---|
| 5,666,217 A | * | 9/1997 | Kaneko et al. | 349/122 |
| 6,074,990 A | * | 6/2000 | Pique et al. | 505/239 |
| 6,204,139 B1 | | 3/2001 | Liu et al. | |
| 6,323,525 B1 | * | 11/2001 | Noguchi et al. | 257/385 |
| 6,473,332 B1 | * | 10/2002 | Ignatiev et al. | 365/148 |
| 6,774,054 B1 | * | 8/2004 | Zhang et al. | 438/781 |
| 2004/0109351 A1 | * | 6/2004 | Morimoto et al. | 365/171 |
| 2004/0235247 A1 | * | 11/2004 | Hsu et al. | 438/257 |

OTHER PUBLICATIONS

Beck et al., "Reproducible switching effect in thin oxide films for memory applications", 2000, Applied Physics Letters, vol. 77, No. 1, pp. 139–141.

Betsuyaku et al., "Material Design for the Fabrication of p–type $SrTiO_3$", 2001, Jpn. J. Appl. Phys., vol. 40, pp. 6911–6912.

(Continued)

*Primary Examiner*—David Nelms
*Assistant Examiner*—Tu-Tu Ho
(74) *Attorney, Agent, or Firm*—Morgan Malino

(57) ABSTRACT

A multilayered conductive memory device capable of storing information individually or as part of an array of memory devices is provided. Boundary control issues at the interface between layers of the device due to the use of incompatible materials can be avoided by intentionally doping the conductive metal oxide layers that are comprised of substantially similar materials. Methods of manufacture are also provided herein.

45 Claims, 9 Drawing Sheets

OTHER PUBLICATIONS

Gerstner et al., "Nonvolatile memory effects in nitrogen doped tetrahedral amorphous carbon thin films", 1998, Journal of Applied Physics, vol. 84, No. 10, pp. 5647–5651.

Kim et al., "Leakage Current Properties of (Ba, Sr)$TiO_3$ Films on Doped (Ba, Sr)$RuO_3$ Electrodes", 2002, Journal of the Korean Physical Society, vol. 41, No. 2, pp. 227–231.

Liu et al., "Electric–pulse–induced reversible resistance change effect in magnetoresistive films", 2000, Applied Physics Letters, vol. 76, No. 19, pp. 2749–2571.

Simmons et al., "New conduction and reversible memory phenomena in thin insulating films", 1967, Proc. Roy. Soc. A., vol. 301, pp. 77–102.

Waser, "Bulk Conductivity and Defect Chemistry of Acceptor–Doped Strontium Titanate in the Quenched State", 1991, J. Am. Ceram. Soc., vol. 74, No. 8, pp. 1934–1940.

Waser, "dc Electrical Degradation of Perovskite–Type Titanates: I, Ceramics", 1990, J. Am. Ceram. Soc., vol. 73, No. 6, pp. 1645–1653.

Watanabe et al., "Current–driven insulator–conductor transition and nonvolatile memory in chromium–doped $SrTiO_3$ single crystals", 2001, Applied Physics Letters, vol. 78, No. 23, pp. 3738–3740.

Watanabe, "Electrical transport through Pb(Zr, Ti)$O_3$ $p$–$n$ and $p$–$p$ heterostructures modulated by bound charges at a ferroelectric surface: Ferroelectric $p$–$n$ diode".

Watanabe et al., "Highly Resolved Conduction Properties of Ferroelectric/Semiconductor Diodes Exhibiting Memory Effect", 1998, Journal of the Korean Physical Society, vol. 32, pp. S1361–S1364.

Zhuang et al., "Novell Colossal Magnetoresistive Thin Film Nonvolatile Resistance Random Access Memory (RAM)", © 2002 IEEE, 0–7803–7463–X/02.

* cited by examiner

MULTI-LAYER CONDUCTIVE MEMORY DEVICE

CROSS REFERENCE TO RELATED APPLICATIONS

This application is a continuation-in-part of U.S. patent application Ser. No. 10/330,512, filed Dec. 26, 2002 now U.S. Pat. No. 6,733,561, which claims the benefit of U.S. Provisional Application No. 60/400,849, filed Aug. 02, 2002, U.S. Provisional Application No. 60/422,922, filed Oct. 31, 2002, and U.S. Provisional Application No. 60/424,083, filed Nov. 5, 2002, all of which are incorporated herein by reference in their entireties and for all purposes. This application is related to the following U.S. patent applications: application Ser. No. 10/360,005, filed Feb. 7, 2003; application Ser. No. 10/330,153, filed Dec. 26, 2002; application Ser. No. 10/330,964, filed Dec. 26, 2002; application Ser. No. 10/330,170, filed Dec. 26, 2002; application Ser. No. 10/330,900, filed Dec. 26, 2002; application Ser. No. 10/330,150, filed Dec. 26, 2002; application Ser. No. 10/330,965, filed Dec. 26, 2002; application Ser. No. 10/249,846, filed May 12, 2003; application Ser. No. 10/249,848, filed May 12, 2003; application Ser. No. 10/612,733, filed Jul. 1, 2003; application Ser. No. 10/613,099, filed Jul. 1, 2003; application Ser. No. 10/612,191, filed Jul. 1, 2003; application Ser. No. 10/612,263, filed Jul. 1, 2003; application Ser. No. 10/612,776, filed Jul. 1, 2003; application Ser. No. 10/604,606, filed Aug. 4, 2003; and application Ser. No. 10/634,636, filed Aug. 4, 2003. All of the above applications are hereby incorporated herein by reference in their entireties and for all purposes.

BACKGROUND OF INVENTION

1. Field of the Invention

The present invention relates generally to computer memory, and more specifically to the fabrication of memory elements.

2. Description of the Related Art

Memory can either be classified as volatile or nonvolatile. Volatile memory is memory that loses its contents when the power is turned off. In contrast, non-volatile memory does not require a continuous power supply to retain information. Most non-volatile memories use solid-state memory devices as memory elements.

Certain conductive metal oxides (CMOs), for example, can be used as solid-state memory devices. The CMOs can retain a resistive state after being exposed to an electronic pulse, which can be generated from two terminals. U.S. Pat. No. 6,204,139, issued Mar. 20, 2001 to Liu et al., incorporated herein by reference for all purposes, describes some perovskite materials that exhibit such characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films," in materials for the 2001 Non-Volatile Memory Technology Symposium, all of which are hereby incorporated by reference for all purposes. However, the materials described in the U.S. Pat. No. 6,204,139 patent are not generally applicable to RAM memory because the resistance of the material, when scaled to small dimensions, is considered to be too large to make a memory with fast access times.

Similarly, the IBM Zurich Research Center has also published three technical papers that discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and nonvolatile memory in chromium-doped SrTiO single crystals," Applied Physics Letters, Vol. 78, No. 23, 4 Jun. 2001, and "Electric current distribution across a metal-insulator-metal structure during bistable switching," Journal of Applied Physics, Vol. 90, No. 6, 15 Sep. 2001, all of which are hereby incorporated by reference for all purposes.

The discovery of the resistance-changing property of certain CMOs, however, is relatively recent and has not yet been implemented in a commercial memory product.

There are continuing efforts to bring a true non-volatile RAM (nvRAM) to market.

SUMMARY OF INVENTION

The present invention provides a multilayered conductive memory device capable of storing information individually or as part of an array of memory devices. Each device includes a first electrode and second electrode in electrical communication with a multilayered memory element that is stacked between the first and second electrodes. Each element includes at least two conductive metal oxide layers disposed in such a manner as to create an interface there between. Furthermore, the resistivity of the multilayered memory element may be changed by applying a first voltage having a first polarity across the electrodes and reversibly changed by applying a second voltage having a second polarity across the electrodes.

In one aspect of the invention each of the conductive metal oxide layers have similar properties including crystalline structures and lattice parameters while in other aspects at least some of the layers do not have similar properties. In another aspect of the invention, dopants are introduced to at least one of the conductive metal oxide layers.

In another aspect of the invention the multilayered memory element has a resistivity that is indicative of the information stored therein. In still another aspect of the invention, the resistivity that is indicative of the information stored occurs in the second conductive metal oxide layer.

Methods of manufacture are also provided herein that include providing an electrode; sequentially sputtering a plurality of conductive metal oxide layers onto the electrode; and depositing onto the final conductive metal oxide layers a second electrode. In some aspects of the invention, the methods described herein utilize a continual process such that risk of contamination is significantly reduced or essentially eliminated.

In other aspects, any of the conductive metal oxide layers are co-sputtered with dopants. In still other aspects the conductive metal oxide layers are subjected to an ion implant step. Finally, in an aspect of the invention, the conductive metal oxide layers may undergo an anneal step.

BRIEF DESCRIPTION OF DRAWINGS

The invention may best be understood by reference to the following description taken in conjunction with the accompanying drawings, in which.

It is to be understood that, in the drawings, like reference numerals designate like structural elements. Also, it is understood that the depictions in the FIGs. are not necessarily to scale.

DETAILED DESCRIPTION

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

The Memory Array

Conventional nonvolatile memory requires three terminal MOSFET-based devices. The layout of such devices is not ideal, usually requiring feature sizes of at least 8 $f^2$ for each memory cell, where f is the minimum feature size. However, not all memory elements require three terminals. If, for example, a memory element is capable of changing its electrical properties (e.g., resistivity) in response to a voltage pulse, only two terminals are required. With only two terminals, a cross point array layout that allows a single cell to be fabricated to a size of 4 $f^2$ can be utilized.

Figure 1:
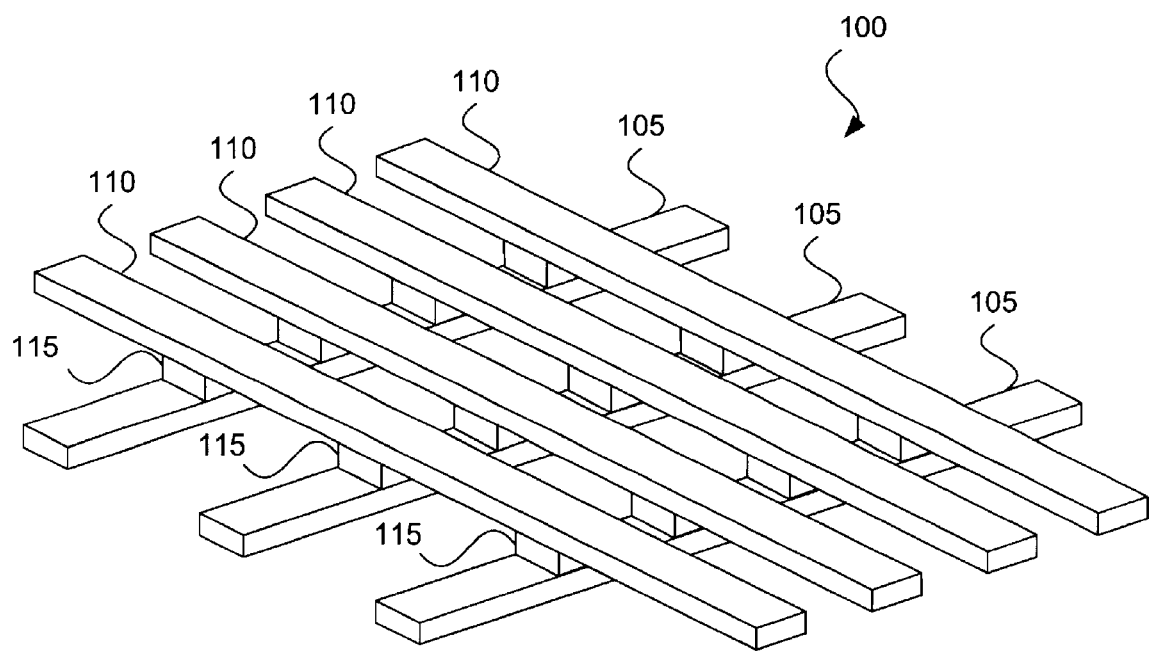
FIG. 1 depicts a perspective view of an exemplary cross point memory array employing a single layer of memory.

FIG. 1 depicts an exemplary cross point array 100 employing a single layer of memory. A bottom layer of x-direction conductive array lines 105 is orthogonal to a top layer of y-direction conductive array lines 110. The x-direction conductive array lines 105 act as a first terminal and the y-direction conductive array lines 110 act as a second terminal to a plurality of memory plugs 115, which are located at the intersections of the conductive array lines 105 and 110. The conductive array lines 105 and 110 are used to both deliver a voltage pulse to the memory plugs 115 and carry current through the memory plugs 115 in order to determine their resistive states.

Conductive array line layers 105 and 110 can generally be constructed of any conductive material, such as aluminum, copper, tungsten or certain ceramics. Depending upon the material, a conductive array line would typically cross between 64 and 8192 perpendicular conductive array lines. Fabrication techniques, feature size and resistivity of material may allow for shorter or longer lines. Although the x-direction and y-direction conductive array lines can be of equal lengths (forming a square cross point array) they can also be of unequal lengths (forming a rectangular cross point array).

Figure 2:
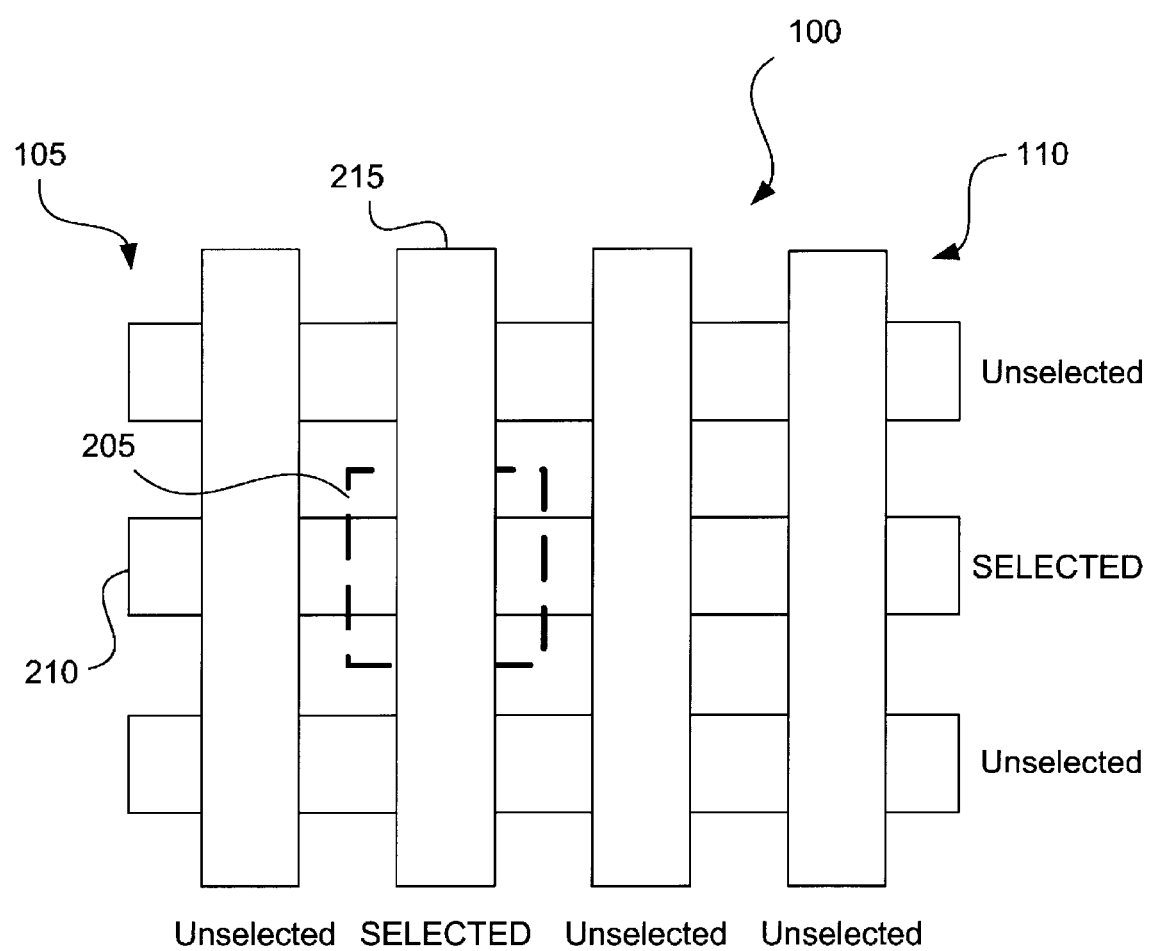
FIG. 2 depicts a plan view of selection of a memory cell in the cross point array depicted in FIG. 1.
Figure 3:
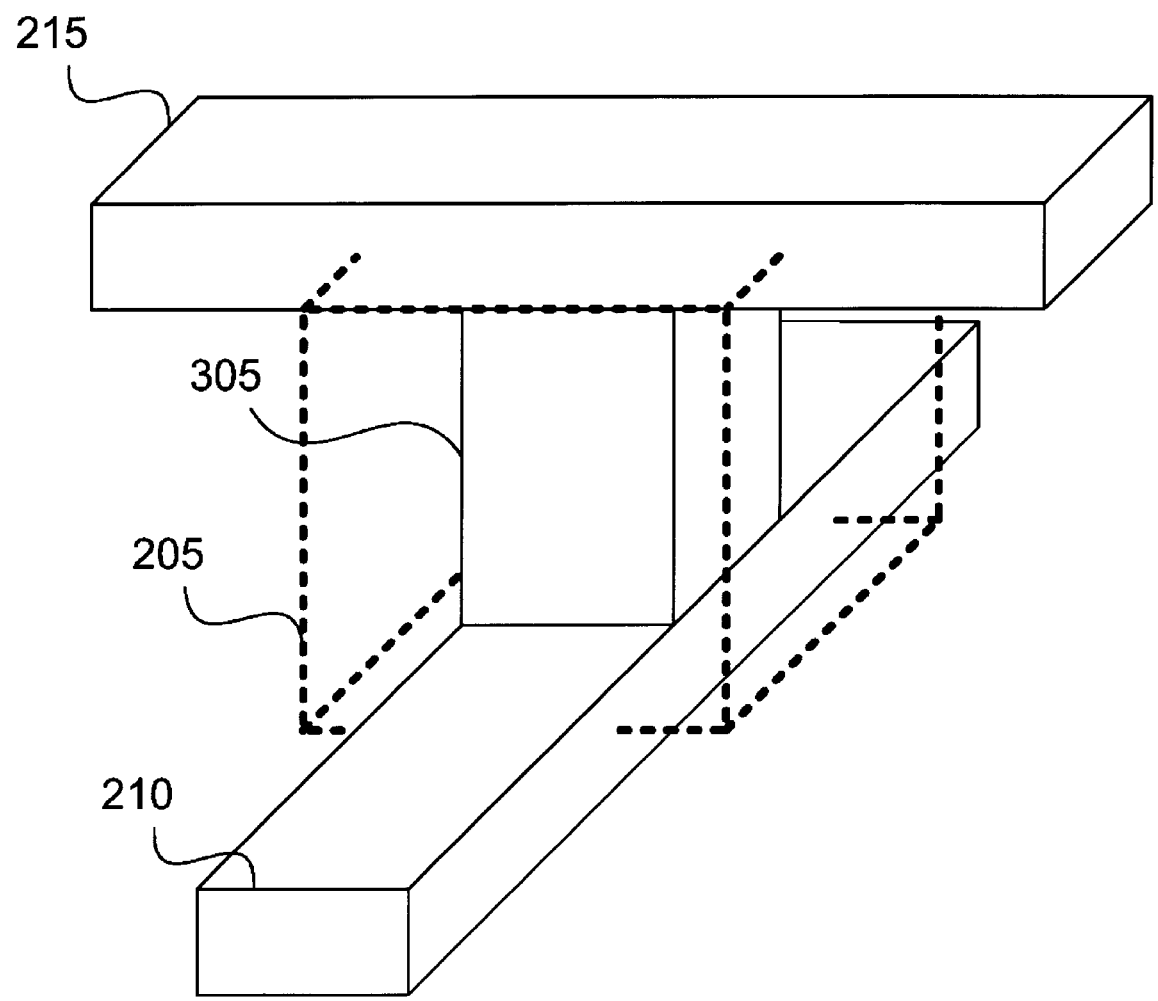
FIG. 3 depicts a perspective view of the boundaries of the selected memory cell depicted in FIG. 2.

FIG. 2 illustrates selection of a memory cell 205 in the cross point array 100. The point of intersection between a single x-direction conductive array line 210 and a single y-direction conductive array line 215 uniquely identifies the single memory cell 205. FIG. 3 illustrates the boundaries of the selected memory cell 205. The memory cell is a repeatable unit that can be theoretically extended in one, two or even three dimensions. One method of repeating the memory cells in the z-direction (orthogonal to the x-y plane) is to use both the bottom and top surfaces of conductive array lines 105 and 110.

Figure 4:
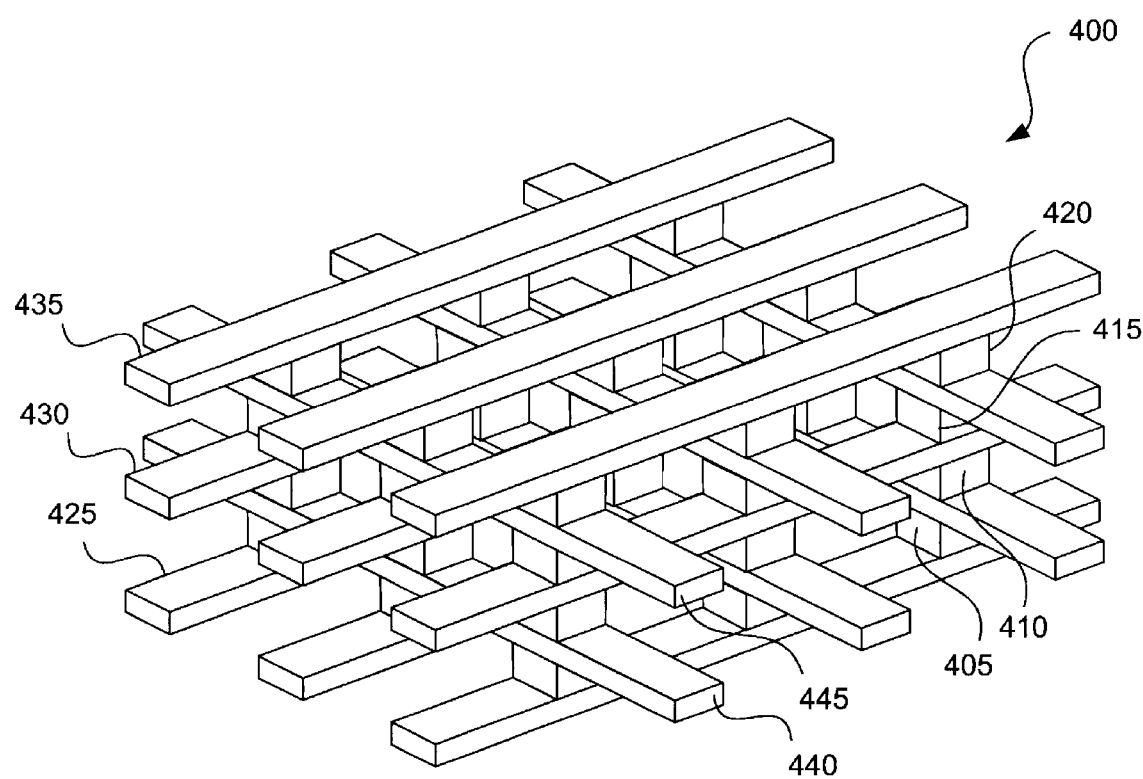
FIG. 4 depicts a perspective view of an exemplary stacked cross point memory array employing four layer of memory.

FIG. 4 depicts an exemplary stacked cross point array 400 employing four memory layers 405, 410, 415, and 420. The memory layers are sandwiched between alternating layers of x-direction conductive array lines 425, 430 and 435 and y-direction conductive array lines 440 and 445 such that each memory layer 405, 410, 415, and 420 is associated with only one x-direction conductive array line layer and one y-direction conductive array line layer. Although the top conductive array line layers 435 and bottom conductive array line layer 425 are only used to supply voltage to a single memory layer 405 and 420, the other conductive array line layers 430, 440, and 445 can be used to supply voltage to both a top and a bottom memory layer 405, 410, 415, or 420.

Referring back to FIG. 2, the repeatable cell that makes up the cross point array 100 can be considered to be a memory plug, plus ½ of the space around the memory plug, plus ½ of an x-direction conductive array line and ½ of a y-direction conductive array line. Of course, ½ of a conductive array line is merely a theoretical construct, since a conductive array line would generally be fabricated to the same width, regardless of whether one or both surfaces of the conductive array line was used. Accordingly, the very top and very bottom layers of conductive array lines (which use only one surface) would typically be fabricated to the same size as all other layers of conductive array lines.

Generally, the benefit of the cross point array is that the active circuitry that drives the cross point array 100 or 400 can be placed beneath the cross point array, therefore reducing the footprint required on a semiconductor substrate. Co-pending U.S. Patent application, "Layout Of Driver Sets In A Cross Point Memory Array," U.S. application Ser. No. 10/612,733, filed Jul. 1, 2003, already incorporated by reference, describes various circuitry that can achieve a small footprint underneath both a single layer cross point array 100 and a stacked cross point array 400.

Figure 5:
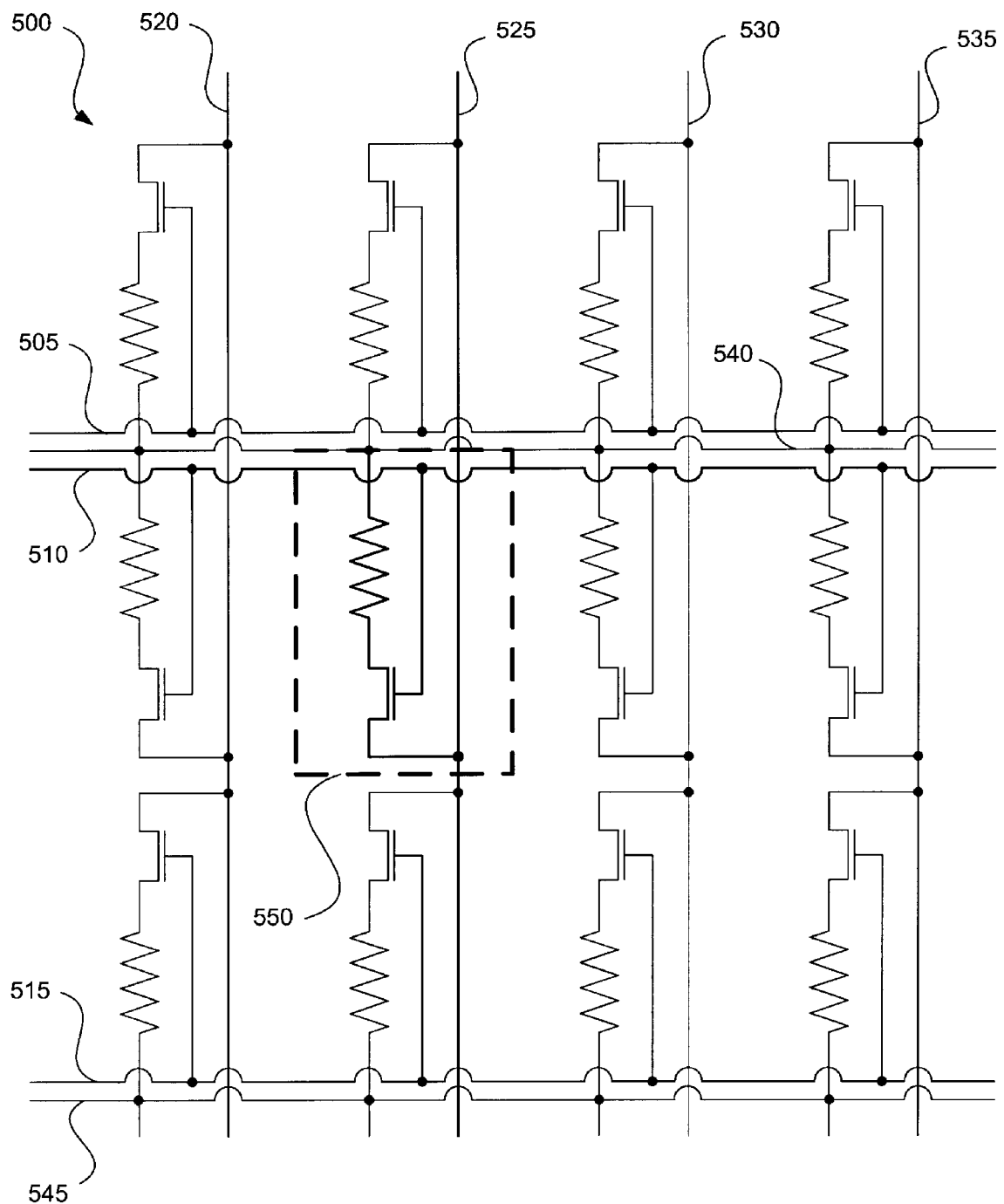
FIG. 5 depicts a schematic diagram of selection of a memory cell in a transistor memory array.

The cross point array is not the only type of memory array that can be used with a two-terminal memory element. FIG. 5 is a schematic representation of an array 500 of memory cells laid out in a two-dimensional transistor memory array 500. Each memory cell in the transistor memory array 500 is connected to one select line 505, 510, or 515, one data line 520, 525, 530, or 535, and a reference line 540 or 545. In one embodiment, all reference lines 540 and 545 are held to the same voltage, and perhaps even tied together. Therefore, a single select line 510 and a single data line 525 uniquely define an individual memory cell 550.

By connecting the select lines 505, 510, and 515 to the gates of field effect transistors (FETs), the select lines 505, 510, and 515 can control whether current from the data lines 520, 525, 530, and 535 are able to pass to the memory plugs. The data lines 520, 525, 530, and 535 both carry the data from the memory cells during READ operations and provides the memory cells with a voltage pulse appropriate to change the resistive state of the memory plug during WRITE operations. Selection circuitry used to select a specific data line 520, 525, 530, or 535 would generally be placed outside the select transistor memory array 500.

Figure 6:
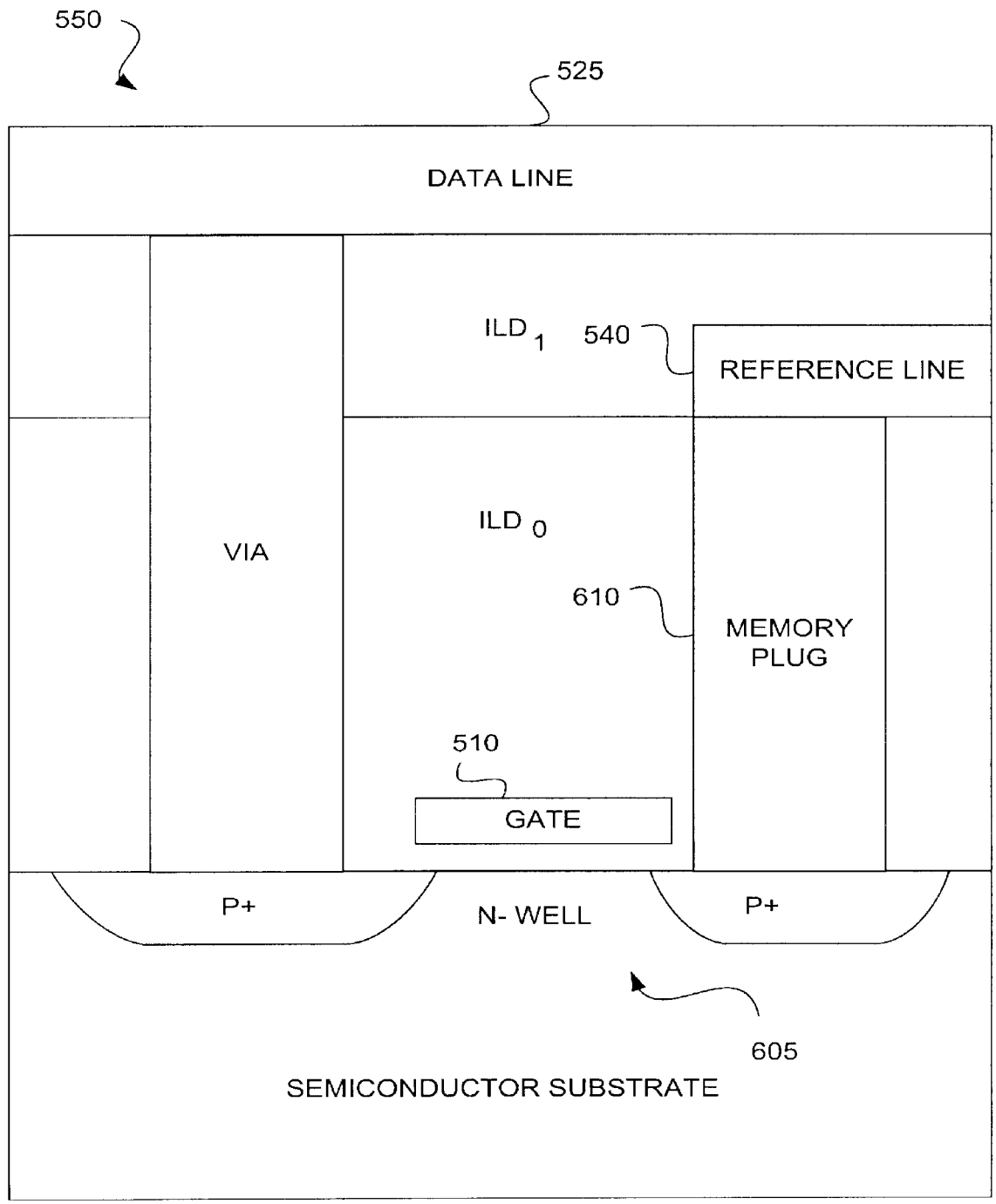
FIG. 6 depicts a cross section of the selected memory cell depicted in FIG. 5.

FIG. 6 is a diagrammatic representation of the memory cell 550 that can be used in a transistor memory array 500.

Each memory cell 550 includes a transistor 605 and a memory plug 610. The transistor 605 is used to permit current from the data line 525 to access the memory plug 610 when an appropriate voltage is applied to the select line 510, which is also the transistor's gate. The reference line 540 might span two cells if the adjacent cells are laid out as the mirror images of each other. Co-pending U.S. Patent application, "Non-Volatile Memory with a Single Transistor and Resistive Memory Element," U.S. application Ser. No. 10/249,848, filed May 12, 2003, already incorporated by reference, describes the specific details of designing and fabricating a select transistor memory array.

The Memory Plug

Each memory plug 305 or 610 contains a memory element along with any other materials that may be desirable for fabrication or functionality. For example, the additional materials might include electrodes and a non-ohmic device, as is described in co-pending application "High Density NVRAM," U.S. application Ser. No. 10/360,005, filed Feb. 7, 2003, already incorporated by reference. The non-ohmic device exhibits a very high resistance regime for a certain range of voltages ($V_{NO-}$ to $V_{NO+}$) and a very low resistance regime for voltages above and below that range. Together, the memory element and the non-ohmic device cause the memory plug 305 or 610 to exhibit a non-linear resistive characteristic. While a non-ohmic device might be desirable in certain arrays, it may not be helpful in other arrays.

Figure 7:
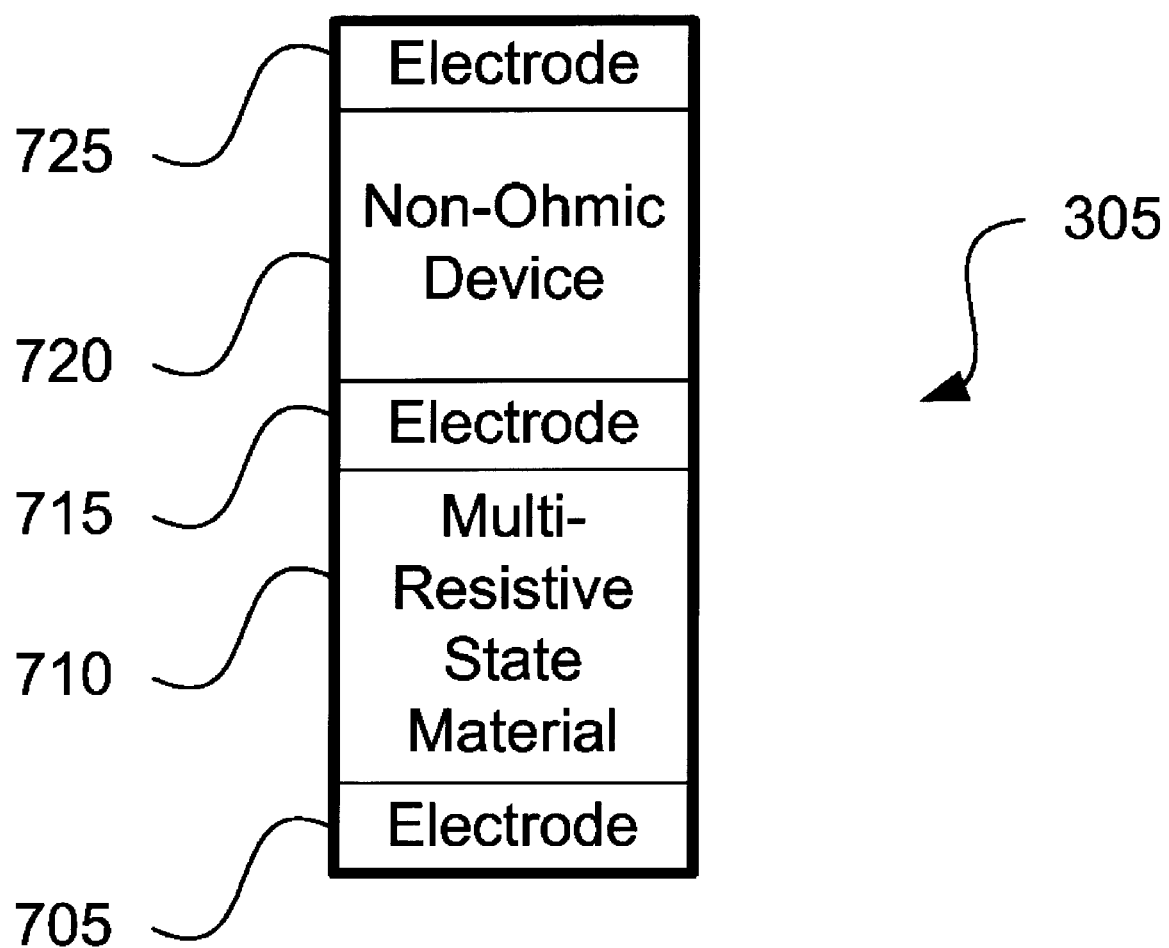
FIG. 7 depicts an elevation view of an exemplary memory plug with five layers.

FIG. 7 depicts a side view of an exemplary five-layer memory plug 305 with a non-ohmic device. The five layers are: a first electrode layer 705, a layer of a multi-resistive state element 710, a second electrode layer 715, a layer making up the non-ohmic device 720, and a third electrode 725. Some layers may actually be made up of multiple thin films. For example, one type of non-ohmic device 720 uses a three film metal-insulator-metal (MIM) structure. Additionally, certain multi-resistive state elements use multiple thin films. Furthermore, not all the layers are required for every memory plug 305 or 610 configuration. For example, certain cross point arrays may use means other than the non-ohmic device 720 to prevent unselected memory plugs from being disturbed. It should be further noted that it is also possible for the memory cell to exhibit non-linear characteristics, as described in U.S. application Ser. No. 10/604,556, already incorporated herein by reference for all purposes. Therefore, the term "resistive memory" and "resistive device" also apply to memories and devices showing non-linear characteristics, and can also be referred to respectively as "conductive memory" and "conductive device."

The Electrodes

The fabrication techniques used for the memory plug 305 or 610 will typically dictate the requirements of the layers beneath the memory plug (e.g., the select lines 505, 510, and 515 in the transistor memory array 500). Certain fabrication process (e.g., solution based spin on followed by high temperature anneal, pulsed laser deposition, sputtering, and metal-organic chemical vapor deposition) might require that refractory metals be used for these layers so that they may withstand the high temperature fabrication process. However, refractive metals have higher resistances, which may limit the number of cells on an array.

Typical electrodes 705, 715 and 725 commonly used in fabrication include Pt, Au, Ag and Al. If the only purpose of the electrodes 705, 715 and 725 is as a barrier to prevent metal inter-diffusion, then a thin layer of metal, e.g. TiN, could be used. However, conductive oxide electrodes may provide advantages beyond simply acting as a metal inter-diffusion barrier.

For example, a conducting oxide electrode might modify the formation and migration of oxygen vacancies in the memory material. Oxygen vacancies can cause degradation of electrical properties in the multi-resistive state element 710. A conducting oxide electrode can also withstand high temperature processing. Most metals either start oxidizing or combining with adjacent materials at temperatures above 400 C. Accordingly, fabrication processes above these temperatures can be considered to be high temperature processing. Additionally, conducting oxide electrodes will not degrade during operation. Regular metal electrodes may degrade due to the electric field and interaction between the metal atoms and the memory material atoms.

Examples of conductive oxides include $LaSrCoO_3$, $RuO_2$, $IrO_2$, $SrRuO_3$, $LaNiO_3$ and doped strontium titanate (STO).

The dopant used in STO can be either Nb or Ta to substitute for titanium atoms, or any rare earth such as La or Pr to substitute for strontium atoms. Generally, a conducting oxide electrode is metallic with resistivity below 1 $\Omega$-cm.

Conducting oxide electrodes can be fabricated directly, or can be made with a material that is not initially an oxide, but is subsequently oxidized during further processing or operation. Ru and Ir are both examples of materials that can be oxidized during processing or operation.

Additionally, certain materials oxidize at a finite rate and allow dual layers to form. For example, Ir might be particularly well suited for making contact to some underlying conductive array line layer 105. When Ir is oxidized, the top of the Ir layer becomes $IrO_2$. Since the $IrO_2$ grows at a finite rate it becomes possible to control the oxidation so that a dual layer of $Ir/IrO_2$ is formed. Such a dual layer could provide a good contact on the un-oxidized bottom while still forming an oxygen barrier on the oxidized top.

Furthermore, some conductive oxides electrodes form a good lattice match with the multi-resistive state element 710, and thus lower crystallization temperature for the conductive material. For example, if the multi-resistive state element 710 is STO, possible conductive oxide electrodes that make a good lattice match include doped STO, $LaSrCoO_3$, and $SrRuO_3$. If the multi-resistive state element 710 is PCMO, possible conductive oxide electrodes include the STO electrodes and also $LaNiO_3$. A seed layer will often be used on top of the thin layer of metal. A seed layer will help the formation of the layer grown or deposited above it. For example, the seed layer could be on Pt, Ru, Ir or TiN. Some seed layer/metal layer matches include $LaNiO_3$ or $SrRuO_3$ on Pt, $IrO_2$ on Ir, $RuO_2$ on Ru, and Pt on TiN.

Another benefit to certain conductive oxide electrodes is that stress may be reduced by more closely matching the conductive oxide electrode's coefficient of thermal expansion to the multi-resistive state element 710.

The electrodes 705, 715 and 725 might be further improved by using a layer of metal such as platinum between the multi-resistive state element layer 710 and the conductive oxide electrode. Such implementations advantageously provide a good barrier with the conductive oxide, and a good contact with an adjacent metal layer.

Barrier layers are generally helpful to prevent inter-diffusion of atoms after different materials have been deposited. For example, barrier layers can block the diffusion of metals, oxygen, hydrogen or water. Binary oxides or nitrides with 2 elements and ternary oxides or nitrides with 3 elements are particularly suited to high temperature processing. Unlike a regular electrode like titanium that oxidizes and becomes non-conductive, titanium nitride will not oxidize and will remain conductive until about 500 C. Ternary oxides oxidize at even higher temperatures, typically about 50 C higher than binary oxides. The rate of oxidation depends on the temperature and the oxygen partial pressure.

Examples of binary nitrides include titanium nitride, tantalum nitride and tungsten nitride. Examples of ternary nitrides include titanium silicon nitride, titanium aluminum nitride, tantalum aluminum nitride, tantalum silicon nitride, and ruthenium titanium nitride. An example of a ternary oxide is ruthenium tantalum oxide.

As will be appreciated by those skilled in the art, an electrode may require other layers, in order to properly function. For example adhesion layers are sometimes necessary. An adhesion layer is used between a substrate and thin-film layer to improve adhesion of the thin-film layer to substrate. Pt does not stick well to $SiO_2$, so a glue layer, such as Ti or $TiO_2$, is used between them for better adhesion. Similarly, a sacrificial barrier layer is an oxide layer that is deposited for the sole purpose of capturing all the oxygen that could otherwise diffuse into other layers, such as the multi-resistive state element 710. The electrode 705 is considered to consist of everything in between x-direction conductive array line 210 and the multi-resistive state element 710, including any adhesion or sacrificial barrier layers, as required. Similarly, the electrode 715 consists of all layers between the multi-resistive state element 710 and the non-ohmic device 720 and the electrode 725 consists of everything in between the non-ohmic device 720 and the y-direction conductive array line 215.

For example, an electrode may includes a TiN or TiAlN layer, an Ir layer and an $IrO_2$ layer to have good metal barrier and oxygen barrier properties. However, such additional layers are only necessary to the extent they are required. Certain conductive oxide electrodes may provide multiple functions. For example, ternary nitrides and ternary oxides that have one component that is either ruthenium or iridium and another component that is either tantalum or titanium can act as both a barrier layer and a sacrificial high-temperature oxygen barrier.

It will be appreciated that the choice of electrode layers 705, 715 and 725 in combination with the multi-resistive state element layer 710 may affect the properties of the memory plug 305 or 610.

Memory Plug Operation

The various properties of the multi-resistive state element 710 will determine both the lowest possible resistance state and the highest possible resistive state. Although the highest operational resistive state ($R_0$) of the memory plug 305 or 610 does not need to be its highest theoretical state and the lowest operational resistance state ($R_1$) does not need to be its lowest theoretical state, designs can set $R_0$ and $R_1$ close to those states for simplicity.

When considering an operating value of the $R_1$ resistive state, parasitic resistances that are in series with the memory plug must also be considered. Sources of resistance include the contacts and the vias, the metal interconnect lines, and the driver circuits. Parasitic resistances might total 100–200$\Omega$, which puts a lower limit on the memory plug resistance. While the parasitic resistance may be overcome through more complicated circuit design, such designs typically result in loss of access time, or a larger die size.

The $R_1$ state of the memory plug may have an optimal value of 10 k$\Omega$ to 100 k$\Omega$. If the $R_1$ state resistance is much less than 10 k$\Omega$, the current consumption will be increased because the cell current is high, and the parasitic resistances will have a larger effect. If the $R_1$ state value is much above 100 k$\Omega$, the RC delays will increase access time. However, workable single state resistive values may still be achieved with resistances as low as 5 k$\Omega$ and as high as 1 M$\Omega$.

Typically, a single state memory would have the operational voltages of $R_0$ and $R_1$ separated by a factor of 10.

For example, if 1 volt were used as a read voltage ($V_R$), $R_1$ might be about 100 k$\Omega$ and $R_0$ might be about 1 M$\Omega$, making the current either 10 $\mu$A or 1 $\mu$A, depending on the resistive state. Since large currents can be destructive to semiconductors fabricated to small dimensions, no more than 10 $\mu$A would be desired for a memory circuit in most cases. Once a $V_R$ is identified, a desired write voltage ($V_W$) can also be determined. Not only should $V_W$ be greater than $V_R$, but it should also be far enough away from $V_R$ to allow minor voltage fluctuations (e.g., due to fabrication imperfections) to have a negligible effect on the multi-resistive state element 710. Similarly, $V_W$ should be greater than $V_{Wth}$, the threshold at which the conductive material starts to change resistivity, for the same reason. A typical $V_W$ might be about 2 volts, and $V_{Wth}$ might be about 1.5 volts.

It should be noted that changes in the resistive property of the memory plugs that are greater than a factor of 10 might be desirable in multi-bit conductive memory cells that have more than two states. Generally, adjusting the pulse width and magnitude of the voltage pulses across the multi-resistive state element results in different resistive states. Since multi-resistive state element 710 can be placed into several different resistive states, multi-bit conductive memory cells are possible. For example, the multi-resistive state element might have a high resistive state of $R_{00}$, a medium-high resistive state of $R_{01}$, a medium-low resistive state of $R_{10}$ and a low resistive state of $R_{11}$. Since multi-bit memories typically have access times longer than single-bit memories, using a factor greater than a 10 times change in resistance from $R_{11}$ to $R_{00}$ is one way to make a multi-bit memory as fast as a single-bit memory. For example, a memory cell that is capable of storing two bits might have the low resistive state be separated from the high resistive state by a factor of 100. A memory cell that is capable of storing three or four bits of information might require the low resistive state be separated from the high resistive state by a factor of 1000. Typically, the intermediary resistive states in a multi-bit memory would evenly subdivide the resistive range between the high resistive state and the low resistive state on a logarithmic scale. For example, if a memory cell that held three bits of memory had a low resistive state of 10 k$\Omega$, the six intermediary states might have resistive states of about 26.8 k$\Omega$, 72.0 k$\Omega$, 193 k$\Omega$, 518 k$\Omega$, 1.39 M$\Omega$, and 3.73 M$\Omega$. The highest resistive state would then be 10 M$\Omega$, 1000 times the value of the low resistive state. Each optimal resistive state could be calculated by using the relationship Log ($R_{110}$)=Log ($R_{111}$)+Log K; Log ($R_{101}$)=Log ($R_{111}$)+2 Log K; Log ($R_{100}$)=Log ($R_{111}$)+3 Log K; ... Log ($R_{000}$)=Log ($R_{111}$)+7 Log K, where Log K=($\frac{1}{7}$) [Log ($R_{000}$)−Log ($R_{111}$)].

Ideally, the multi-resistive state element 710 should switch very quickly from one resistive state to another. Typically, anything less than 50 nanoseconds would be an appropriate switching speed for applications such as mobile phones, PDAs or other portable electronics devices. Additionally, once the multi-resistive state element 710 is placed in a resistive state, it should be able to retain that state for long periods of time. Ideally, the material should retain its resistive state for over ten years. Since the read voltage should not affect the resistive state, repeated application of the read voltage over ten years should not change the resistive state of the multi-resistive state element 710.

The multi-resistive State Element

Figure 8A:
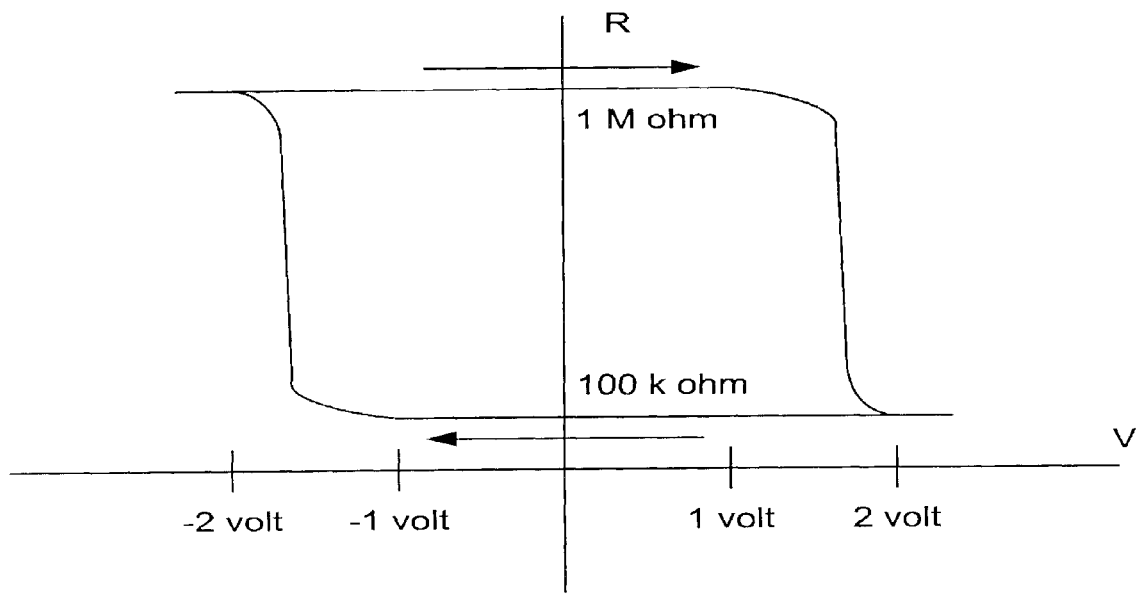
FIG. 8A depicts a graph illustrating exemplary RV characteristics of a memory element initially biased in one direction.

Importantly, the multi-resistive state element 710 preferably has a hysteresis that allows non-destructive reads. As shown in FIG. 8A any voltages between $-V_R$ (depicted as $-1$ volt) and $+V_R$ (depicted as 1 volt) will have no effect on the resistive state of the memory element (i.e., it will remain at either 100 kΩ or 1 MΩ). Therefore, a WRITE operation is not necessary after a READ operation for such materials.

The hysteresis shown in FIG. 8A has two write threshold voltages, one for when the multi-resistive state element 710 is in the low resistive state $R_1$ and one for when the multi-resistive state element 710 is in the high resistive state $R_0$. In the low resistive state $R_1$, the first write threshold voltage $-V_{Wth}$ is the point above which any voltages applied across the multi-resistive state element 710 have substantially no effect on the resistive state of the multi-resistive state element 710 and below which a voltage pulse will alter the resistance of the multi-resistive state element 710. Similarly, in the high resistive state $R_0$, the second write threshold voltage $+V_{Wth}$ is the point below which any voltages applied across the multi-resistive state element 710 have substantially no effect on the resistive state of the multi-resistive state element 710 and above which a voltage pulse will alter the resistance of the multi-resistive state element 710.

When initially fabricated, the multi-resistive state element 710 may be in a high resistive state $R_0$. The multi-resistive state element 710 then transitions from its high resistive state $R_0$ to a low resistive state $R_1$ in response to a voltage pulse. Whether the bottom terminal is at +3V and the top terminal is at −3V in order to lower the resistive sate or vice-versa depends upon the specific properties of the material that is used. FIG. 8A is an example of the multi-resistive state element 710 that requires a +2V pulse to lower its resistive state and FIG. 8B, a mirror image of FIG. 8A, is an example of the multi-resistive state element 710 that requires a −2V pulse to lower its resistive state.

Generally, the chemical and materials properties of the multi-resistive state element 710 are selected to meet the electrical specifications set forth above. For example, the material preferably has a resistivity of between about 0.1 Ω-cm to 1 Ω-cm (although workable values may be as high as 5 Ω-cm and the multi-resistive state element may be able to achieve a much lower resistivity), exhibits a change in resistance of at least about 10×, and has this resistance change triggered by the application of a voltage pulse of not longer than about 100 ns duration and not greater than about 10V in magnitude.

The multi-resistive state element 710 will generally, but not necessarily, be crystalline, either as a single crystalline structure or a polycrystalline structure. One class of multi-resistive state element 710 are perovskites that include two or more metals, the metals being selected from the group consisting of transition metals, alkaline earth metals and rare earth metals. The perovskites can be any number of compositions, including manganites (e.g., $Pr_{0.7}Ca_{0.3}MnO_3$, $Pr_{0.5}Ca_{0.5}MnO_3$ and other PCMOs, LCMOs, etc.), titanates (e.g., STO:Cr), zirconates (e.g., SZO:Cr), other materials such as $Ca_2Nb_2O_7$:Cr, and $Ta_2O_5$:Cr, and high Tc superconductors (e.g., YBCO). Specifically, $MnO_3$, when combined with the rare earth metals La, Pr or some combination thereof and the alkaline earth metals Ca, Sr or some combination thereof have been found to produce a particularly effective multi-resistive state element 710 for use in the memory plug 305 or 610. The compounds that make up the perovskite class of multi-resistive state elements 710 include both normal conductive metal oxides and conductive complex metal oxides. Further, some oxides which may not be conductive in their pure form may be used as they become conductive through the addition of dopants, or if they are used as a very thin layer (e.g., in the order of tens of Angstroms) in which case tunneling conduction can be achieved.

Figure 8B:
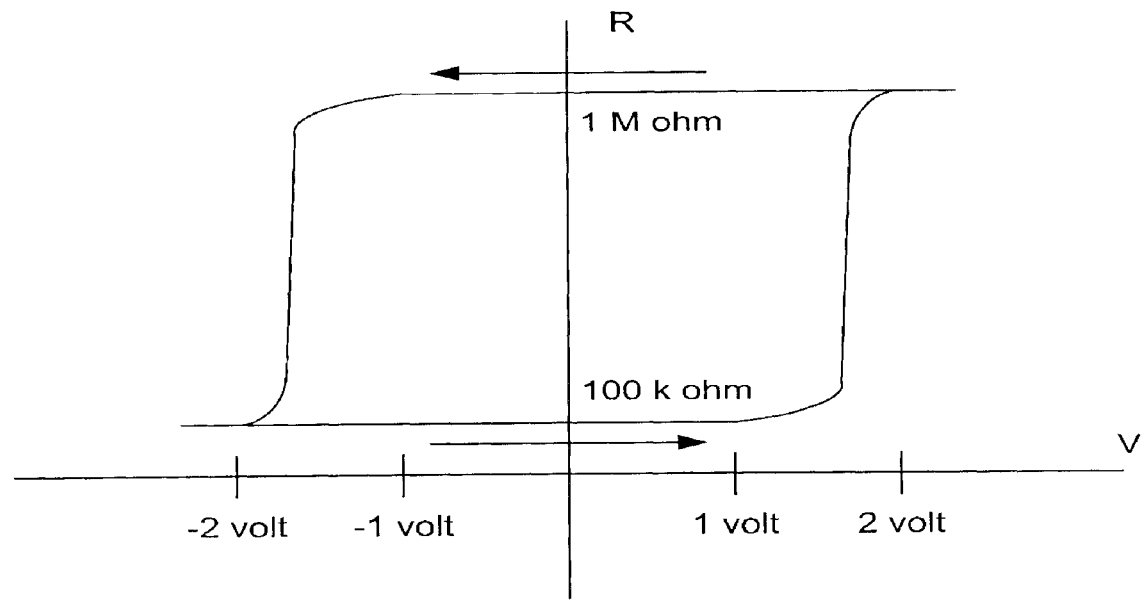
FIG. 8B depicts a graph illustrating exemplary RV characteristics of a memory element initially biased in a direction opposite to the memory element of FIG. 8A.

Multi-resistive state elements 710, however, are not limited to perovskites. Specifically, any material that has a hysteresis effect similar to what is shown in FIG. 8A or 8B could be used in the memory plug 305 or 610. Trapped charges are one mechanism by which the hysteresis effect is created.

Some examples of amorphous materials exhibiting such hysteresis include SiO, as described in "New conduction and reversible memory phenomena in thin insulating films" by J. G. Simmons and R. R. Verderber, Proc. Roy. Soc. A. 301, 1967 pp. 77–102, hereby incorporated by reference for all purposes. Another example is carbon doped with nitrogen, as described in "Nonvolatile memory effects in nitrogen doped tetrahedral amorphous carbon thin films" by E. G. Gerstner and D. R. McKenzie, Journal of Applied Physics, Vol. 84, Num. 10, November 1998, pp. 5647–5651, hereby incorporated by reference for all purposes.

Several different mechanisms might cause a material to have trapped charges. Co-pending U.S. patent applications, "A 2-Terminal Trapped Charge Memory Device with Voltage Switchable Multi-Level Resistance," U.S. application Ser. No. 10/634,636, filed Aug. 4, 2003, and "Multi-resistive state element That Uses Dopants," U.S. application Ser. No. 10/604,606, filed Aug. 4, 2003, both already incorporated by reference, describe some mechanisms that may cause a material to have trapped charges.

The Multi-Resistive State Element/Electrode Interface

Trapped charges can be further encouraged at the interface between the multi-resistive state element 710 and its electrode 705 and 715. Although the interfaces between the multi-resistive state element 710 and both the top electrode 715 and the bottom electrode 705 can be treated, it is often useful to only treat one interface. Properly treating a single interface, or subjecting the two interfaces to dissimilar treatments, can bias the memory element in a single direction, thereby encouraging the hysteresis effect.

Treatment of the interface can occur through, for example, ion implantation. In ion implantation accelerated ions penetrate a solid surface up to certain depth that is determined by the ion energy. Ion implantation can be used to introduce dopants, to form buried layers, and to modify solid surfaces. Ion implantation can occur after the bottom electrode 705 is deposited, after the multi-resistive state material 710 is deposited, or after the top electrode 715 is deposited.

Another treatment method is to expose the bottom electrode 705, the multi-resistive state material 710, or the top electrode 715 to either an anneal or a gas at a given temperature within a given ambient. Some anneals can be easily integrated into fabrication. For example, if the array 100 or 500 only has a single memory plug 305 or 610 layer, then the bottom electrode 705 might be subjected to high temperatures in order to properly form the multi-resistive state material 710. However, the top electrode 715 can then be deposited at temperatures far below what is necessary for forming the multi-resistive state material 710. Similar results can be obtained by laser treating one of the surfaces, or exposing one of the surfaces to a plasma process (such as plasma etching).

Yet another treatment method is to insert a layer of material in between one of the multi-resistive state material 710/electrode 705 or 715 interfaces. Common deposition techniques include sputtering, chemical vapor deposition, evaporation, and atomic layer deposition. Such a material might be deposited solely for the purpose of treating the interface, or might serve multiple purposes, such as additionally acting as a seed layer in the bottom electrode 705.

Additionally or alternatively, the layer of material might cause a chemical reaction with the multi-resistive state material 710, and perhaps the electrode 705 or 715. A reaction might simply occur as a result of the material coming into contact with the multi-resistive state material 710, or might require an anneal or exposure to a gas (either immediately after the material's deposition, or after the entire memory plug 305 or 610 is deposited).

An alternative method of causing a chemical reaction in the multi-resistive state material is to use an electrode 705 or 715 that reacts with the multi-resistive state material 710. Such an electrode 705 or 715 can either be immediately reactive, or require a catalyst for reaction (such as anneal or exposure to a gas).

Another treatment method might be to expose the entire structure and/or a particular surface layer to a physical re-sputtering, typically by using Ar and/or $O_2$ or other inert gas plasma. Re-sputtering is a technique commonly used to clean-up surfaces. Since a new film is not deposited when the plasma hits the surface in the sputtering chamber, it can be considered to be the opposite of sputtering. Similarly, the surface can be exposed to an inert ion from an ion gun, bombarding the surface with accelerated inert ions, such as ionized Ar in order to modify the surface composition or the surface crystalline structure.

The Multi-Resistive State Element/Other Interfaces

In an alternative embodiment, a structure where the memory effect can be located independently of the interface between the electrode and the memory material is disclosed. For example, at least one additional interface can be created within the multi-resistive state element by adding an additional conductive metal oxide layer.

The additional conductive metal oxide layer need not comprise the same material, however, interfaces between conductive metal oxide layers are difficult areas to control. As can be appreciated by one skilled in the art, mismatched lattices, possible inter-atom diffusion mechanisms, and adhesion issues are all relevant. Therefore, using substantially similar materials is one way to avoid such control issues.

Including dopants in only a portion of the conductive metal oxide, or using different dopants in adjacent portions allows the use of substantially similar materials for the conductive metal oxide layers, thus avoiding the control issues while imparting enough differences between the substantially similar materials to constitute and create an active interface. Additionally, dopants may impart additional benefits, such as enhancing the memory effect of the memory element by creating traps.

Figure 9:
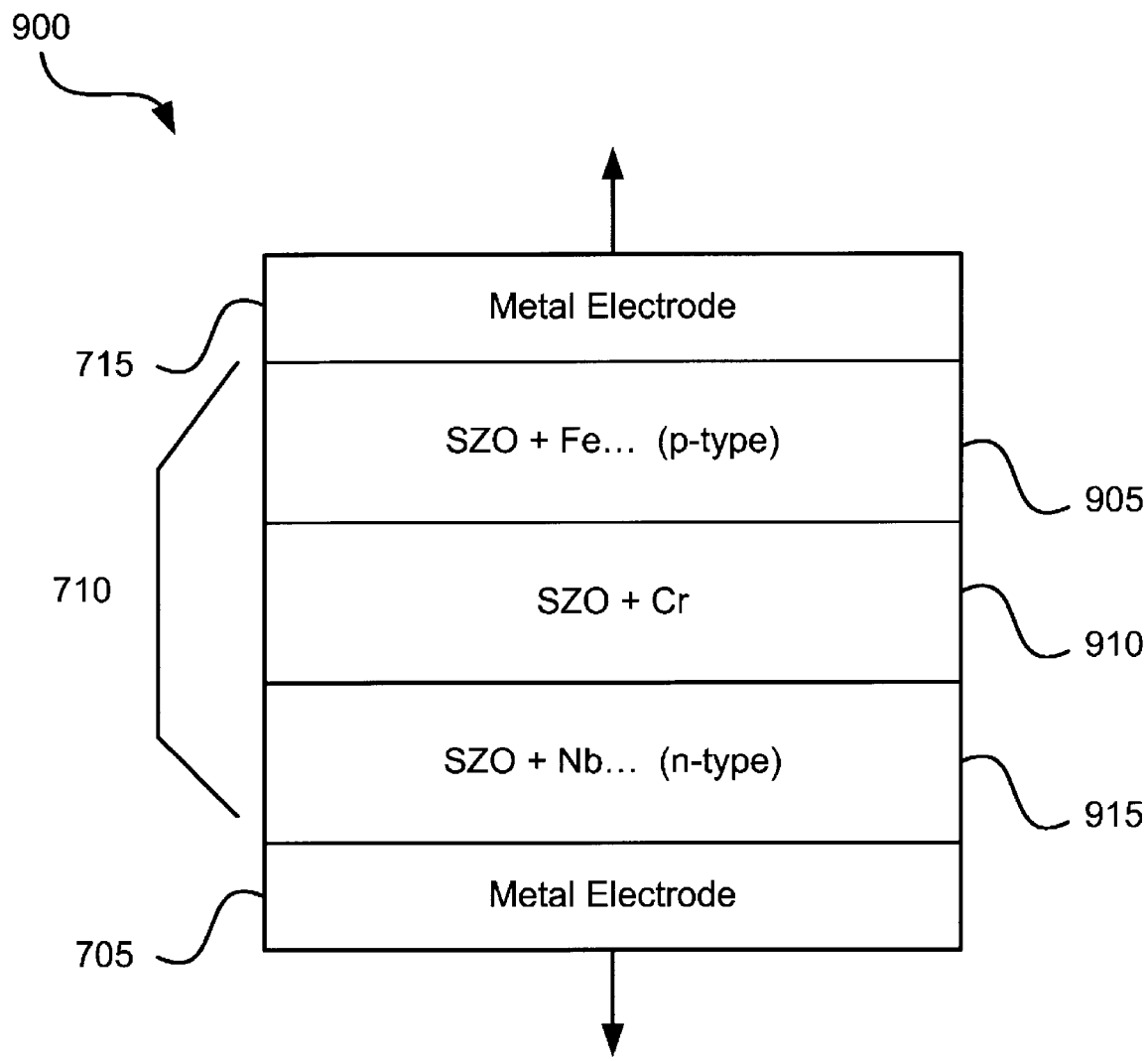
FIG. 9 depicts a cross sectional view of an exemplary multilayered conductive memory element.

Thus, for example, in one aspect of the present invention, FIG. 9 depicts a cross sectional view of an exemplary memory plug 900. A conductive metal oxide layer 910 that includes a metal oxide strontium zirconate doped with chromium is sandwiched between two substantially similar conductive metal oxide layers 905 and 915. The top conductive metal oxide layer is strontium zirconate doped with iron, which results in a p-type metal oxide layer 905. The bottom conductive metal oxide layer is strontium zirconate doped with niobium, which results in an n-type metal oxide layer 915. The thickness of layers 905 and 915 is not critical, typically 500 Å may be used, but any thickness from 100 to 1000 Å will usually be adequate. The only constraint is to ensure that the layer is thick enough that it is not completely depleted of charges when a voltage is applied across the memory element. The thickness of layer 910 is more critical, as tunneling conduction is preferred and will usually be achieved between 10 and 100 Å of thickness, depending on the voltage applied to the memory element. A typical thickness of 30 Å is adequate.

By causing the top metal oxide layer 905 to have a surplus of either holes or electrons, and causing the bottom metal oxide layer 915 to have a surplus of either electrons or holes (the opposite of the top metal oxide layer 905), it is possible to create an asymmetry in the electrical properties of the memory element. The asymmetry ensures that a program pulse of one polarity always changes the material to a higher resistance, and a program pulse of the other polarity changes the material to a lower resistance. If the top and bottom conductive metal oxide materials are the same, there is no asymmetry, and, at first, the memory material may switch either way. To avoid this lack of directionality, preconditioning techniques can be used, such as applying a high voltage pulse across the memory material. However, by using slightly different materials such an initialization step can be minimized or avoided.

Another way to create an asymmetry between the bottom and top metal oxide layers is to use the same type material, that is both layers being n-type (surplus of mobile electrons) or p-type (surplus of mobile holes), with a different concentration of mobile carriers.

Notably, the dopants included in the conductive metal oxide layers 905, 910, and 915 are typically used in low concentration. Generally, the amount of dopant included in the conductive metal oxide is less than 10% by weight and more particularly approximately 1% by weight.

The dopants used to create an n-type and a p-type region can be chosen with the following guidelines. An n-type dopant has a higher valence (more positive charge) than the lattice atom it replaces, therefore n-type dopants which substitute for Zr or Ti in strontium zirconate or strontium titanate include Nb and Ta. Similarly, n-type dopants which substitute for Sr include Y, La, and all of the lanthanide elements. A p-type dopant has a lower valence (less positive charge) than the lattice atom it replaces, therefore p-type dopants which substitute for Zr or Ti include Cr, Mn, Fe, Co, Ni, and Al. Another way to obtain hole conduction in strontium zirconate would be to dope with Nb on the Zr site and simultaneously with nitrogen on two adjacent oxygen sites to obtain p-type conductivity.

In still another embodiment of the present invention, the bottom conductive metal oxide 915 material can be made out of praseodymium calcium manganese oxide ($Pr_xCa_{1-x}MnO_3$) with a selected ratio of $Mn_3$ or $Mn_4$ ions. This will change the manganite semiconductor to an n-type or a p-type semiconductor, respectively. The ratio of $Mn_3$ or $Mn_4$ can be adjusted by varying, during deposition, the ratio of Pr and Ca atoms. The top conductive metal oxide 905 can be made out of $Pr_xCa_{1-x}MnO_3$ with another specific ratio of $Mn_4$ or $Mn_3$ ions so that the top metal oxide layer 905 and the bottom metal oxide layer 915 are opposite polarities. For example, an n-type $Pr_xCa_{1-x}MnO_3$ could be used for the bottom conductive metal oxide 915 and a p-type $Pr_xCa_{1-x}MnO_3$ could be used for the top conductive metal oxide 905.

In similar fashion, one skilled in the art can appreciate that only two layers of conductive metal oxides may be utilized without departing from the scope of the present invention. In particular, either the bottom conductive metal oxide layer or the top conductive metal oxide layer can be excluded from the memory device because an active interface is still present between the remaining conductive metal oxide layers and the electron or hole imbalance is sufficient to provide asymmetry. As such, the use of three layers as described above is illustrative only and not indicative of any inherent limitation of the scope of the disclosure as any of a number of conductive metal oxide layers are contemplated by the present invention.

As another example of the present invention, it is also possible to use different materials to form the conductive metal oxide layers, as long as these materials are compatible. Example compatible materials would have a similar crystal structure and similar lattice parameters. Strontium ruthenate (SRO) and strontium titanate STO constitute an example of such a material, where the distance between Sr—Ru atoms in a SRO crystal and Sr—Ti atoms in a STO crystal are within a few percentage points of each other.

The criteria for other compatible materials would be the same as the criteria used for a good epitaxy. For example, Si is compatible with $Al_2O_3$ (Sapphire) since one plane of $Al_2O_3$ crystal closely matches an integral multiple of Si crystal plane.

Methods of Manufacture

One method for creating the multilayered conductive memory device described herein is to sputter the conductive metal oxide material layers onto an appropriate substrate. Other techniques such as pulse laser deposition or MOCVD can also be used, but not all techniques are appropriate for high volume manufacturing. In a preferred embodiment, all conductive metal oxide layers are sputtered using a continual process methodology. A continual process methodology requires holding a wafer or appropriate substrate under continuous vacuum during material deposition. By maintaining vacuum integrity during the sputter process, the risk of contamination, for example by uncontrolled oxygen exposure, is significantly reduced or altogether eliminated.

As noted above, the use of dopants in conjunction with the conductive metal oxide material eliminates interface control issues associated with using different materials in a multilayered conductive memory element. To introduce appropriate dopants at the various layers, a co-sputtering technique can be used by which different material targets (such as a conductive metal oxide and a dopant) are used in the same chamber and sputtered simultaneously. This approach allows for adjustment to achieve an appropriate dopant to conductive metal oxide ratio. Although such co-sputtering equipment is not commonly used in a production environment, the equipment is nevertheless wellknown in the art and is readily available through general laboratory suppliers like: Kurt J. Lesker Company and Denton Vacuum.

An alternate method to introduce dopants is to implant the conductive metal oxide layer after its deposition on either the substrate or another conductive metal oxide layer. For example, a first conductive metal oxide layer can be implanted after deposition creating a specific structure at the interface between the first conductive metal oxide layer and a second, later deposited conductive metal oxide layer. The second conductive metal oxide layer can, in turn, be implanted after deposition. In a preferred embodiment, an anneal step can be added after these implant steps to further drive the implanted ions into the conductive metal oxide layers. Notably, implanting the final conductive metal oxide layer may require either that the layer be sufficiently thin to allow for full penetration of the dopant, or that the final layer be annealed for a period sufficient to allow the dopant to modify the underlying interface between the final conductive metal oxide layer and the immediately preceding metal oxide layer. These steps may be repeated for as many or as few layers as is deemed appropriate to the specific application.

Concluding Remarks

Although the invention has been described in its presently contemplated best mode, it is clear that it is susceptible to numerous modifications, modes of operation and embodiments, all within the ability and skill of those familiar with the art and without exercise of further inventive activity. Accordingly, that which is intended to be protected by Letters Patent is set forth in the claims and includes all variations and modifications that fall within the spirit and scope of the claim.

What is claimed is:

1. A conductive memory device capable of storing information comprising:
   a first electrode;
   a first conductive metal oxide layer stacked upon and in electrical communication with the first electrode;
   a second conductive metal oxide layer stacked upon and in electrical communication with the hint conductive metal oxide layer;
   a third conductive metal oxide layer stacked upon and in electrical communication with the second conductive metal oxide layer; and
   a second electrode stacked upon and in electrical communication with the third conductive metal oxide layer, wherein the conductive memory device has a resistance that is indicative of the information stored therein;
   wherein at least two of the first, second, and third conductive metal oxide layers comprise conductive metal oxides that are not identical to each other.

2. The conducive memory device of claim 1, wherein the first, second and third conductive metal oxide layers are substantially compatible.

3. The conductive memory device of claim 1, wherein the first conductive layer is n-type or p-type, end the third conductive layer is of opposite type.

4. The conductive memory device of claim 1, wherein the first and third conductive layers are both of the same n-type or p-type, with different concentrations of mobile carriers.

5. The conductive memory device of claim 1 wherein:
   the resistance of the conductive memory device may be increased by applying a first voltage having a first polarity across the first and second electrodes and decreased by applying a second voltage having a second polarity across the first and second electrodes.

6. The conductive memory device of claim 5 wherein:
   an initialization pulse across the first and second electrodes has no affect on establishing which polarity is needed to increase the resistance of the conductive memory device.

7. The conductive memory device of claim 2 wherein:
   the second conductive metal oxide layer has properties that differ from both the first conductive metal oxide layer and the third conductive metal oxide layer.

8. The conductive memory device of claim 7 wherein:
   the differences in properties between the conductive metal oxide layers determine the first polarity.

9. The conductive memory device of claim 1, wherein:
   the first conductive metal oxide layer and the third conductive metal oxide layer are strontium titanate.

10. The conductive memory device of claim 1, wherein:
    the first conductive metal oxide layer and the third conductive metal oxide layer are strontium zirconate.

11. The conductive memory device of claim 10, wherein:
    the second conductive metal oxide layer is doped strontium zirconate.

12. The conductive memory device of claim 11, wherein the second conductive metal oxide layer is doped with Chromium.

13. The conductive memory device of claim 10, wherein:
the first conductive metal oxide layer is strontium zirconate doped with an element with a higher valence than zirconium, such as niobium or tantalum, or doped with an element with a higher valence than strontium, such as yttrium or lanthanum.

14. The conductive memory device of claim 10, wherein the third conductive metal oxide layer is strontium zirconate doped with an element that has a lower valence, such as iron or chromium.

15. The conductive memory device of claim 1, wherein:
the first conductive metal oxide layer and the third conductive metal oxide layer are praseodymium calcium manganese oxide ($Pr_x Ca_{1-x}MnO_3$).

16. The conductive memory device of claim 15, wherein:
the first conductive metal oxide layer and the third conductive metal oxide layer do not have the same ratios of praseodymium to calcium.

17. The conductive memory device of claim 1, wherein:
the second conductive metal oxide layer is between 10 and 500 angstroms thick.

18. The conductive memory device of claim 11, wherein:
the second conductive metal oxide layer is about 30 angstroms thick.

19. The conductive memory device of claim 1, wherein:
the first conductive metal oxide layer and the third conductive metal oxide layer are each between 100 and 1000 angstroms thick.

20. The conductive memory device of claim 19, wherein:
the first conductive metal oxide layer and the third conductive metal oxide layer are each about 500 angstroms thick.

21. The conductive memory device of claim 1 wherein:
at least two of the first conductive metal oxide layer, the second conductive metal oxide layer, and the third conductive metal oxide layer have identical crystalline structures.

22. The conductive memory device of claim 1, wherein:
at least two of the first conductive metal oxide layer, the second conductive metal oxide layer, and the third conductive metal oxide layer have similar lattice parameters.

23. The conductive memory device of claim 1, wherein:
at least two of the first conductive metal oxide layer, the second conductive metal oxide layer, and the third conductive metal oxide layer have similar crystalline structures.

24. The conductive memory device of claim 1, wherein:
at least two of the first conductive metal oxide layer, the second conductive metal oxide layer, and the third conductive metal oxide layer have similar compositions.

25. The conductive memory device of claim 1, wherein the conductive memory device is rewriteable.

26. The conductive memory device of claim 1, wherein:
at least one of the conductive metal oxide layers includes up to 10% dopant.

27. A conductive memory device capable of storing information comprising:
a first electrode;
a first conductive metal oxide layer stacked upon and in electrical communication with the first electrode;
a second conductive metal oxide layer stacked upon and in electrical communication with the first conductive metal oxide layer;
a second electrode stacked upon and in electrical communication with the second conductive metal oxide layer; wherein the conductive memory device has a resistivity that is indicative of the information stored therein;
wherein at least one conductive metal oxide layer is doped with a dopant.

28. The conductive memory device of claim 27 wherein:
the resistivity of the conductive memory device may be increased by applying a first voltage having a first polarity across the first and second electrodes and decreased by applying a second voltage having a second polarity across the first and second electrodes.

29. The conductive memory device of claim 28 wherein:
an initialization pulse of the second polarity across the first and second electrodes has no effect on establishing which polarity is needed to increase the resistivity of the conductive memory device.

30. The conductive memory device of claim 27 wherein:
the resistivity that is indicative of the information stored occurs in the first conductive metal oxide layer.

31. The conductive memory device of claim 27 wherein:
either the first or second conductive metal oxide layer is strontium zirconate doped as n-type semiconductor; and
the remaining of the first or second conductive metal oxide layer is strontium zirconate doped as a p-type semiconductor.

32. The conductive memory device of claim 27 wherein:
the resistivity that is indicative of the information stored occurs in the second conductive metal oxide layer.

33. A method of manufacturing a conductive memory device comprising:
depositing a bottom electrode;
depositing a bottom conductive metal oxide layer onto the bottom electrode;
depositing onto the bottom conductive metal oxide layer a top conductive metal oxide layer such that the top conductive metal oxide layer is in electrical communication with the bottom conductive metal oxide layer;
depositing a top electrode onto the top conductive metal oxide layer;
wherein either the top conductive metal oxide layer or the bottom conductive metal oxide layer or both is doped with a dopant; and
wherein the resistance of the conductive memory can be modified during operation to store information.

34. The method of manufacturing a conductive memory device of claim 33 wherein:
a continual sputtering process is used for depositing the bottom conductive metal oxide layer and the top metal oxide layer.

35. The method of manufacturing a conductive memory device of claim 33 wherein the bottom and top conductive metal oxide layers are substantially compatible.

36. The method of manufacturing a conductive memory device of claim 33, further comprising:
depositing onto the top conductive metal oxide layer a third conductive metal oxide layer such that the third conductive metal oxide layer is in electrical communication with the top conductive metal oxide layer;

wherein either the bottom conductive metal oxide layer is a p-type material and the third conductive metal oxide layer is an n-type material, or the bottom conductive metal oxide layer is an n-type material and the third conductive metal oxide layer is a p-type material.

37. The method of manufacturing a conductive memory device of claim 36, wherein:

a continual sputtering process is used for depositing the bottom conductive metal oxide layer, the top metal oxide layer and the third metal oxide layer.

38. The method of manufacturing a conductive memory device of claim 36, wherein:

at least one of the bottom conductive metal oxide layer, the top conductive metal oxide layer, and the third conductive metal oxide layer contains a plurality of elements.

39. The method of manufacturing a conductive memory device of claim 38, wherein:

the plurality of elements are co-sputtered.

40. The method of manufacturing a conductive memory device of claim 36, wherein:

at least one of the bottom conductive metal oxide layer, the top conductive, metal oxide layer, and the third conductive metal oxide layer further contains at least one dopant.

41. The method of manufacturing a conductive memory device of claim 40, wherein the at least one of the bottom conductive metal oxide layer, the top conductive metal oxide layer, and the third conductive metal oxide layer and the at least one dopant are co-sputtered.

42. The method of manufacturing a conductive memory device of claim 36, further comprising:

ion implantation after depositing either the bottom metal oxide layer, the top conductive metal oxide layer, or the third conductive metal oxide layer.

43. The method of manufacturing a conductive memory device of claim 42, further comprising:

an anneal following the ion implantation.

44. The method of manufacturing a conductive memory device of claim 36, further comprising:

an anneal after depositing the bottom conductive metal oxide layer, the top conductive metal oxide layer, or the third conductive metal oxide layer.

45. The method of manufacturing a conductive memory device of claim 33 wherein:

the manufacture of the conductive memory element is preceded by depositing et least one bottom electrode layer; and the manufacture of the conductive memory element is followed by depositing at least one top electrode layer.

* * * * *

UNITED STATES PATENT AND TRADEMARK OFFICE
CERTIFICATE OF CORRECTION

PATENT NO. : 6,965,137 B2 Page 1 of 1
APPLICATION NO. : 10/605757
DATED : November 15, 2005
INVENTOR(S) : Wayne Kinney et al.

It is certified that error appears in the above-identified patent and that said Letters Patent is hereby corrected as shown below:

(a) In regards to Claim 1, in Col. 14, Line 18,
Please replace the word "hint" with the word "first" ;

(b) In regards to Claim 3, in Col. 14, Line 35,
Please replace the word "end" with the word "and" ;

AND (c) In regards to Claim 40, in Col. 17, Line 23,
Please delete the comma "," between the words "top conductive" and the words "metal oxide layer" such that Line 23 correctly reads "the top conductive metal oxide layer, and the third".

Signed and Sealed this

First Day of August, 2006

JON W. DUDAS
*Director of the United States Patent and Trademark Office*